United States Patent
Kittl et al.

(10) Patent No.: US 9,978,833 B2
(45) Date of Patent: May 22, 2018

(54) METHODS FOR VARIED STRAIN ON NANO-SCALE FIELD EFFECT TRANSISTOR DEVICES

(71) Applicant: Samsung Electronics Co., Ltd., Suwon-si, Gyeonggi-do (KR)

(72) Inventors: Jorge A. Kittl, Round Rock, TX (US); Joon Goo Hong, Austin, TX (US); Dharmendar Reddy Palle, Austin, TX (US); Mark S. Rodder, Dallas, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 52 days.

(21) Appl. No.: 15/289,951

(22) Filed: Oct. 10, 2016

(65) Prior Publication Data

US 2017/0263704 A1    Sep. 14, 2017

Related U.S. Application Data

(60) Provisional application No. 62/307,360, filed on Mar. 11, 2016.

(51) Int. Cl.
*H01L 27/12* (2006.01)
*H01L 29/06* (2006.01)
(Continued)

(52) U.S. Cl.
CPC .... *H01L 29/0665* (2013.01); *H01L 21/02532* (2013.01); *H01L 21/823807* (2013.01);
(Continued)

(58) Field of Classification Search
USPC .......... 257/351, E29.325–E29.346, 257/E29.049–E29.067, E29.237, 257/E29.256–E29.26, E21.428–E21.43, 257/E21.618, E21.634, E21.431–E21.435, 257/E21.619–E21.62, 151–153, 249, 257/314–320, 331, 366, 387, 412,
(Continued)

(56) References Cited

U.S. PATENT DOCUMENTS

8,338,259 B2    12/2012    Wu et al.
8,507,951 B2    8/2013    Wang et al.
(Continued)

*Primary Examiner* — Tram H Nguyen
(74) *Attorney, Agent, or Firm* — Renaissance IP Law Group LLP (57) ABSTRACT

A semiconductor device and a method to form the semiconductor device are disclosed. An n-channel component of the semiconductor device includes a first horizontal nanosheet (hNS) stack and a p-channel component includes a second hNS stack. The first hNS stack includes a first gate structure having a plurality of first gate layers and at least one first channel layer. A first internal spacer is disposed between at least one first gate layer and a first source/drain structure in which the first internal spacer has a first length. The second hNS stack includes a second gate structure having a plurality of second gate layers and at least one second channel layer. A second internal spacer is disposed between at least one second gate layer and a second source/drain structure in which the second internal spacer has a second length that is greater than the first length.

18 Claims, 7 Drawing Sheets

(51) Int. Cl.
    *H01L 29/10*     (2006.01)
    *H01L 29/08*     (2006.01)
    *H01L 27/092*     (2006.01)
    *H01L 29/78*     (2006.01)
    *H01L 29/786*     (2006.01)
    *H01L 29/66*     (2006.01)
    *H01L 21/8238*     (2006.01)
    *H01L 21/02*     (2006.01)
    *H01L 21/84*     (2006.01)

(52) U.S. Cl.
    CPC ........... *H01L 21/823814* (2013.01); *H01L 21/823828* (2013.01); *H01L 21/84* (2013.01); *H01L 27/092* (2013.01); *H01L 27/1211* (2013.01); *H01L 29/0847* (2013.01); *H01L 29/1033* (2013.01); *H01L 29/6656* (2013.01); *H01L 29/66545* (2013.01); *H01L 29/66553* (2013.01); *H01L 29/66636* (2013.01); *H01L 29/66742* (2013.01); *H01L 29/786* (2013.01); *H01L 29/7842* (2013.01)

(58) Field of Classification Search
    USPC ... 257/E29.125–E29.131, E29.134–E29.138, 257/E21.14–E29.161, E29.275, E29.319, 257/268, 197, 324, 288, 401; 438/283, 438/585; 977/750, 845
    See application file for complete search history.

(56) References Cited

U.S. PATENT DOCUMENTS 9,202,919 B1     12/2015     Liu et al.
9,362,355 B1 *     6/2016     Cheng .............. H01L 29/66742

* cited by examiner

METHODS FOR VARIED STRAIN ON NANO-SCALE FIELD EFFECT TRANSISTOR DEVICES

RELATED APPLICATION DATA

This application claims the priority benefit under 35 U.S.C. § 119(e) of U.S. Patent Application Ser. No. 62/307,360, filed Mar. 11, 2016, which is hereby incorporated by reference.

FIELD

This disclosure relates generally to semiconductor devices, and more specifically, to methods to form nanoscale field effect transistor (FET) devices having varied channel strains.

BACKGROUND

One basic component of a semiconductor device is a transistor, commonly referred to as a FET. Various types of FET devices exist, and the function, composition, and use of FET devices varies. One type of FET device commonly used in semiconductor devices is a metal-oxide-semiconductor field effect transistor (MOSFET). MOSFET devices generally come in two distinct types, p-channel MOSFET (pMOS) devices, and n-channel MOSFET (nMOS) devices. Digital-data processing devices may include a combination of pMOS and nMOS devices, which are arranged in a complimentary metal-oxide-semiconductor (CMOS) arrangement. Transistor size constraints in advanced semiconductor devices have required more compact transistor designs and topologies. One such design includes a transistor device that has multi-gate structures that are combined to provide scalable CMOS circuits for digital applications.

Some semiconductor devices use horizontal nanosheets (hNS) or horizontal nanowires (hNW) shaped channels for the transistor devices, which will be respectively referred to herein as hNS devices or hNW devices. In hNS devices, at least some of the channels of the device are shaped as nanosheets that are surrounded by gate-all around structures. Nanosheets are structures having one scaled dimension that is typically in the range of about 2 nm to about 10 nm, while the other dimensions may be larger (e.g., in a range of about 10 nm to about 100 nm). When used in channels of MOS devices surrounded by gate-all around structures, the hNS may have a cross-section (normal to the direction of current flow in the channel) that typically has a smaller dimension (e.g., of about 2 nm to about 10 nm) and a larger dimension (e.g., of about 10 nm to about 100 nm). When the two dimensions of the cross-section of the hNS are similar (e.g., both in a range of about 2 nm to about 10 nm), it is referred to as NW. Although the present embodiments are primarily described in relation to hNS devices, it should be understood that the embodiments disclosed herein may be equally applied to hNW devices. During processes of fabricating hNS or hNW structures, strain may be introduced in the channel or channels of the devices. The strain may be a physical or mechanical result of the materials and process sequences used in fabricating the structure. Also, varying strain may be caused by variations in physical dimensions of the hNS or hNW structures. Variations in strain parameters may affect performance of a device. The effects may be adverse, or may enhance the performance of the device, depending upon the device configuration and the value of the strain parameter.

SUMMARY

Methods for forming varied strain on nanoscale hNS or hNW semiconductor devices are presented. In an embodiment, a semiconductor device includes an n-channel component that may include a first horizontal nanosheet (hNS) stack and a first source/drain structure in which the first hNS stack may include a first gate structure having a plurality of first gate layers and at least one first channel layer on an underlayer, a first gate layer may be in contact with the underlayer and each first channel layer may be in contact with at least one first gate layer, the first source/drain structure may be disposed at one end of a channel length formed by the first hNS stack, a first internal spacer may be disposed between at least one first gate layer and the first source/drain structure in which the first internal spacer has a first length; and a p-channel component that may include a second hNS stack and a second source/drain structure in which the second hNS stack may include a second gate structure having a plurality of second gate layers and at least one second channel layer on the underlayer, a second gate layer may be in contact with the underlayer and each second channel layer may be in contact with at least one second gate layer, the second source/drain structure may be disposed at one end of a channel length formed by the second hNS stack, and a second internal spacer may be disposed between at least one second gate layer and the second source/drain structure in which the second internal spacer has a second length that is greater than the first length. In one embodiment, the first length may be less than the second length by about 2 nm to about 5 nm, inclusive. In another embodiment, a strain in each first channel layer may include a tensile strain, and a strain in each second channel layer may include a neutral strain or a compressive strain.

In an embodiment, a method to form a semiconductor device may include: forming a first horizontal nanosheet (hNS) stack for an n-channel component in which the first hNS stack may include a plurality of first sacrificial layers and at least one first channel layer on an underlayer in which a first sacrificial layer may be in contact with the underlayer, each first channel layer may be in contact with at least one first sacrificial layer, the first sacrificial layers may be formed from SiGe and the at least one first channel layer may be formed from Si; forming a second hNS stack for a p-channel component in which the second hNS stack may include a plurality of second sacrificial layers and at least one second channel layer on the underlayer, a second sacrificial layer may be in contact with the underlayer in which each second channel layer may be in contact with at least one second sacrificial layer and the second sacrificial layers may be formed from SiGe and the at least one second channel layer may be formed from Si; forming first source drain recesses and second source/drain recesses in which the first source/drain recesses may be disposed at ends of a channel formed by the first hNS stack and the second source/drain recesses may be disposed at ends of a channel formed by the second hNS stack; forming a first internal spacer recess within at least one of the first source/drain recesses between the first sacrificial layers and the first channel layers in which the first internal spacer recess has a first length; and forming a second internal spacer recess within at least one of the second source/drain recesses between the second sacrificial layers and the second channel layers in which the second internal spacer recess has a second length that is greater than the first length.

In an embodiment, a method to form a semiconductor device may include: forming a first horizontal nanosheet (hNS) stack for an n-channel component in which the first hNS stack may include a plurality of first sacrificial layers and at least one first channel layer on an underlayer and a first sacrificial layer may be in contact with the underlayer, each first channel layer may be in contact with at least one first sacrificial layer, and the first sacrificial layers may be formed from SiGe and the at least one first channel layer may be formed from Si in which each first sacrificial layer may include a first percentage Ge content; forming a second hNS stack for a p-channel component in which the second hNS stack may include a plurality of second sacrificial layers and at least one second channel layer on the underlayer and a second sacrificial layer may be in contact with the underlayer, each second channel layer may be in contact with at least one second sacrificial layer, the second sacrificial layers may be formed from SiGe and the at least one second channel layer may be formed from Si in which each second sacrificial layer has a second percentage Ge content in which the second percentage Ge content may be less than or equal to the first percentage Ge content; forming first source drain recesses and second source/drain recesses in which the first source/drain recesses may be disposed at ends of a channel formed by the first hNS stack and the second source/drain recesses may be disposed at ends of a channel formed by the second hNS stack; forming at least one first internal spacer recess within at least one of the first source/drain recesses between the first sacrificial layers and the first channel layers; and forming at least one second internal spacer recess within at least one of the second source/drain recesses between the second sacrificial layers and the second channel layers.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Embodiments of methods and systems for fabrication of semiconductor devices having hNS or hNW channels are described herein. The disclosed embodiments may be applied to many different channel material systems, but in particular to silicon (Si) channel hNS or hNW devices. Advantageously, the disclosed embodiments may allow for different strain in a pMOS component and an nMOS component of a CMOS device. In one particular embodiment, the strain in a pMOS component may be close to neutral or may be compressive, while the strain in an nMOS component may be tensile. In one embodiment, substantially the same channel material may be used for both the nMOS and the pMOS components, but the strains in the two components may be different because of the varying thickness of the recess of the sacrificial layer that is used to form internal spacers. For example, the tensile strain may be greater in the nMOS component than in the pMOS component. Similarly, the compressive strain may be greater in the pMOS component than in the nMOS component. In yet another embodiment, the nMOS component may have tensile channel strain and the pMOS component may have neutral or compressive channel strain.

Figure 1:
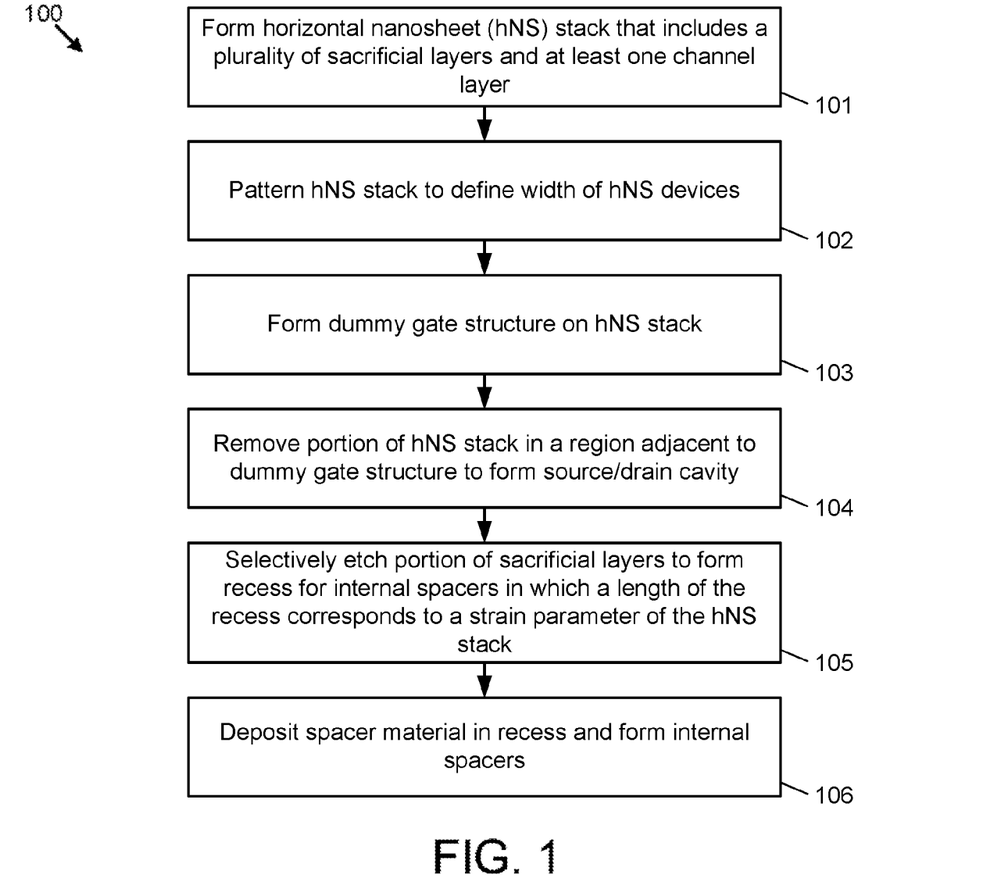
FIG. 1 depicts a flow diagram of one embodiment of a method to form nanoscale semiconductor devices having varied channel strains according to the subject matter disclosed herein.

FIG. 1 depicts a flow diagram of one embodiment of a method 100 to form nanoscale semiconductor devices having varied channel strains according to the subject matter disclosed herein. In an embodiment, the method 100 may include forming an hNS stack for a semiconductor device in which the hNS stack includes at least one channel layer and at least one sacrificial layer, as indicated at block 101. At block 102, the hNS stack may be patterned and etched to define a width of the hNS device (i.e., as measured along the j-axis, which is depicted in FIGS. 2A-6B as being into the figure). At block 103, a dummy gate structure may be formed on the patterned hNS stack. Additionally, at block 104, a portion of the hNS stack may be removed in one or more regions that are adjacent to the gate structure to form one or more source and/or drain cavities. At block 105, a portion of the sacrificial layers of the hNS stack may be selectively etched to form a recess in the sacrificial layers in which the depth of the recess may define a strain parameter of the hNS structure. Additionally, at block 106, a spacer material may be deposited in the recess, thereby forming a spacer (referred to herein as an "internal spacer") in the regions that the sacrificial layers were recessed. The method 100 may be incorporated in a fabrication flow of hNS or hNW devices, and as such, may be preceded and/or followed by additional operations and/or processes. For example, operations and/or processes that may be used to complete the fabrication of an hNS device may include regrowth of the source-drain regions, and a replacement gate process. During a replacement gate process, the portions of sacrificial layers remaining in the structure may be removed selectively from the channel layers. While the key operations pertinent for the subject matter disclosed herein are described in the method, additional operations and/or processes may be used in between the disclosed operations, as appropriate for fabrication of the hNS devices.

It should be understood that detailed implementation of the method depicted in FIG. 1 may vary depending upon whether the method is used to form a pMOS component or an nMOS component, and depending upon whether an hNW or an hNS is formed. Design-specific processing parameters and materials may be varied, depending upon the particular application and characteristics of the semiconductor device that are to be formed. Further embodiments of the method 100 are respectively described in connection with FIGS. 2A-6A for nMOS devices and FIGS. 2B-6B for pMOS devices. It should be understood that certain operations that result in the structures depicted in FIGS. 2A-6B may be performed simultaneously for both an nMOS component and a pMOS component, while other operations may be performed separately for an nMOS component and for a pMOS component. Indeed, it is common to perform some operations of the process flows for an nMOS component separately from the process flow for a pMOS component because the materials and processing parameters used to fabricate nMOS components may be different from those used for fabricating pMOS components.

Figure 2A:
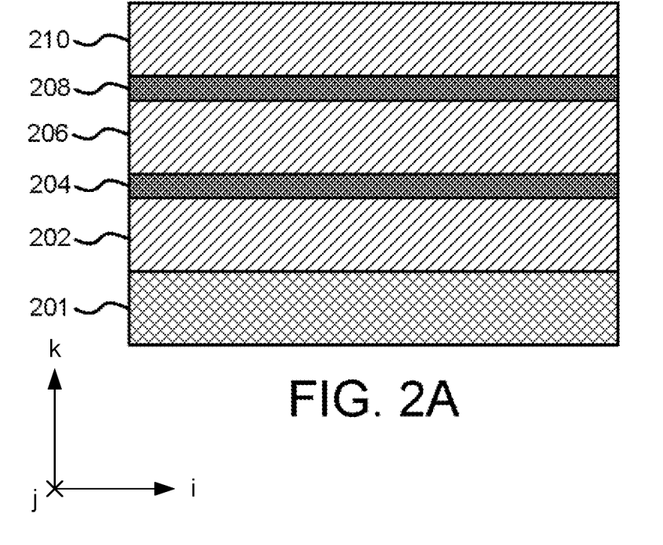
FIGS. 2A and 2B respectively depict cross-sectional views of embodiments of hNS stacks for an nMOS component and for a pMOS component at one stage of fabrication according to the subject matter disclosed herein.
Figure 2B:
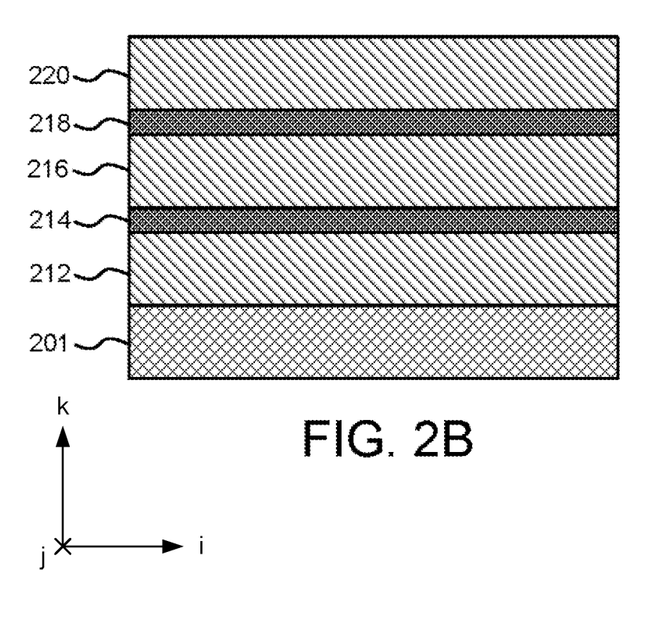

FIGS. 2A and 2B respectively depict cross-sectional views of embodiments of hNS stacks for an nMOS component and for a pMOS component at one stage of fabrication according to the subject matter disclosed herein. More specifically, the embodiment of the hNS stack depicted in FIG. 2A represents an hNS stack that may be used to fabricate an nMOS component of a semiconductor device. In an embodiment, the hNS stack of FIG. 2A may be formed on a substrate or underlayer 201. In an embodiment, the hNS stack of FIG. 2A may include a plurality of sacrificial layers 202, 206 and 210, and a plurality of channel layers 204 and 208 interspersed between the plurality of sacrificial layers 202, 206 and 210. The sacrificial layers 202, 206 and 210 and the channel layers 204 and 208 may be formed in an alternating sequence in which a sacrificial layer is formed directly on the substrate or underlayer 201. As depicted in FIG. 2A, the sacrificial layers 202, 206 and 210, and the channel layers 204 and 208 are each substantially parallel to a plane formed by the i- and j-axes. Each of the sacrificial layers 202, 206 and 210, and the channels layers 204 and 208 have a thickness that is measured in a direction that is substantially parallel to the k-axis. In one embodiment, the sacrificial layers 202, 206 and 210 may be formed from a silicon germanium ($Si_{1-x}Ge_x$) material. In such an embodiment, the channel layers 204 and 208 may be formed of a Si material. It should be understood that although only three sacrificial layers and two channels layers are depicted in FIG. 2A as forming hNS stack for an nMOS component, an hNS stack according to the subject matter disclosed herein may include more or fewer sacrificial and channel layers than depicted in FIG. 2A.

The embodiment of the hNS stack depicted in FIG. 2B represents an hNS stack that may be used to fabricate a pMOS component of the semiconductor device. In an embodiment, the stack is formed on a substrate or underlayer 201. In an embodiment, the hNS stack of FIG. 2B may include a plurality of sacrificial layers 212, 216 and 220, and a plurality of channel layers 214 and 218 interspersed between the plurality of sacrificial layers 212, 216 and 220. The sacrificial layers 212, 216 and 220 and the channel layers 214 and 218 may be formed in an alternating sequence in which a sacrificial layer is formed directly on the substrate or underlayer 201. As depicted in FIG. 2B, the sacrificial layers 212, 216 and 220, and the channel layers 214 and 218 are each substantially parallel to a plane formed by the i- and j-axes. Each of the sacrificial layers 212, 216 and 220, and the channels layers 214 and 218 have a thickness that is measured in a direction that is substantially parallel to the k-axis. In one embodiment, the sacrificial layers 212, 216 and 220 may be formed of a silicon germanium ($Si_{1-y}Ge_y$) material. In such an embodiment, the channel layers 214 and 218 may be formed of a Si material. It should be understood that although only three sacrificial layers and two channels layers are depicted in FIG. 2B as forming hNS stack for a pMOS component, an hNS stack according to the subject matter disclosed herein may include more or fewer sacrificial and channel layers than depicted in FIG. 2B.

In some embodiments, there may be only one stack deposition, i.e., the same stack may be deposited for nFET and pFET devices. In some embodiments that use silicon germanium sacrificial layers for both nMOS and pMOS hNS stacks, there may be more than one stack deposition so that at least some nFET devices have different (i.e., greater) Ge content in the sacrificial layers than the pFET devices. In such an embodiment, stack depositions are masked and performed at different steps in the fabrication flow. In some embodiments, the materials forming the nFET stacks of FIG. 2A and the pFET stacks of FIG. 2B may include material compositions described above in which x may be different than y, and in which x may be greater than y. The choice of x and y may lead to greater tensile strain in the channel of nFET devices than in the channel of pFET devices.

Figure 3A:
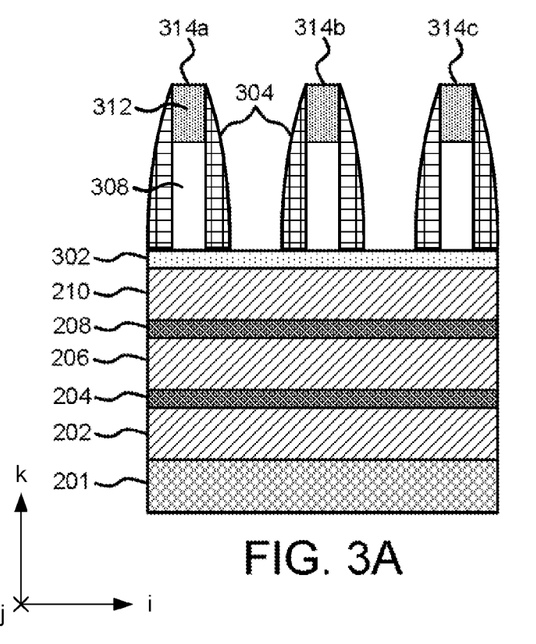
FIGS. 3A and 3B respectively depict cross-sectional view of embodiments of hNS stacks for an nMOS component and for a pMOS component at another stage of fabrication according to the subject matter disclosed herein.
Figure 3B:
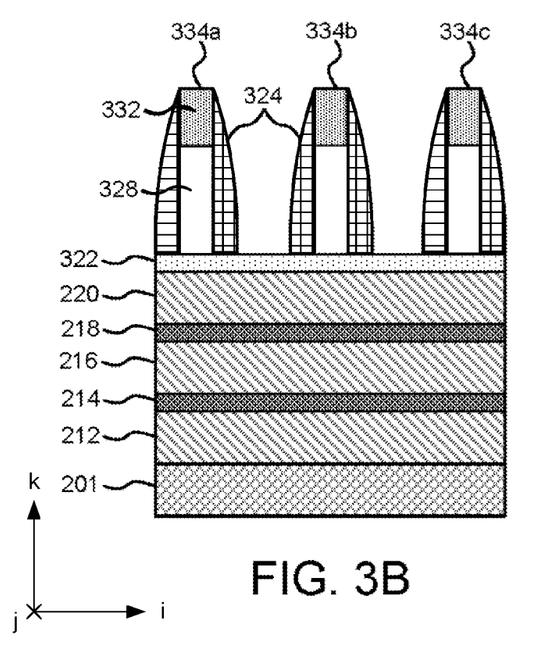

At the stages of fabrication depicted in FIGS. 3A and 3B, gate structures 314a-c, and 334a-c are respectively formed over the hNS stack for an nMOS component and for a pMOS component. In such an embodiment, the gate structures 314a-c and 334a-c may be dummy gates. The first set of gate structures 314a-c depicted in FIG. 3A may include an insulator layer 302, such as an oxide material, a polysilicon layer 308 and a capping layer 312, such as Si nitride material. The gate structures 314a-c may also include a spacer material 304. Similarly, the gate structures 334a-c depicted in FIG. 3B may include an insulator layer 322, a polysilicon layer 328, a capping layer 322, and spacers 324.

In some embodiments, the same processes are applied to nFET and pFET devices. In other embodiments, processes for nFET and pFET may differ and be applied at different operational points during fabrication (i.e., with other type of devices masked). In some embodiments, the thickness of the spacers 304 and 324 may be different in nFET or pFET, if desired (for example, to match internal spacer thicknesses in the hNS stack).

Figure 4A:
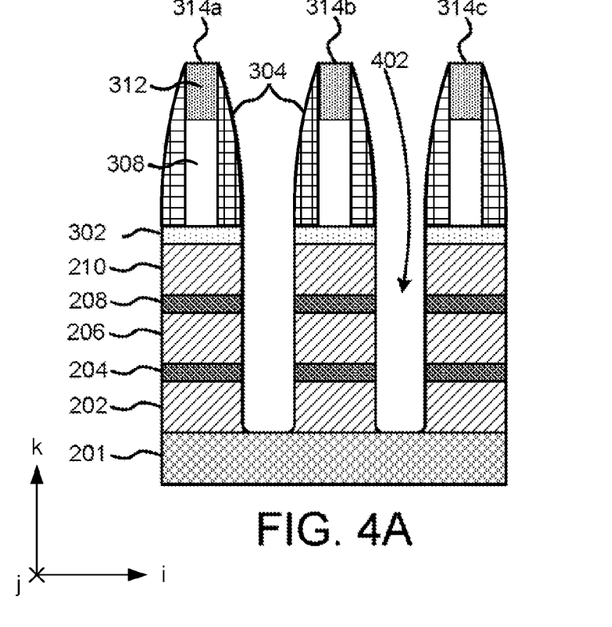
FIGS. 4A and 4B respectively depict cross-sectional view of embodiments of hNS stacks for an nMOS component and for a pMOS component at yet another stage of fabrication according to the subject matter disclosed herein.
Figure 4B:
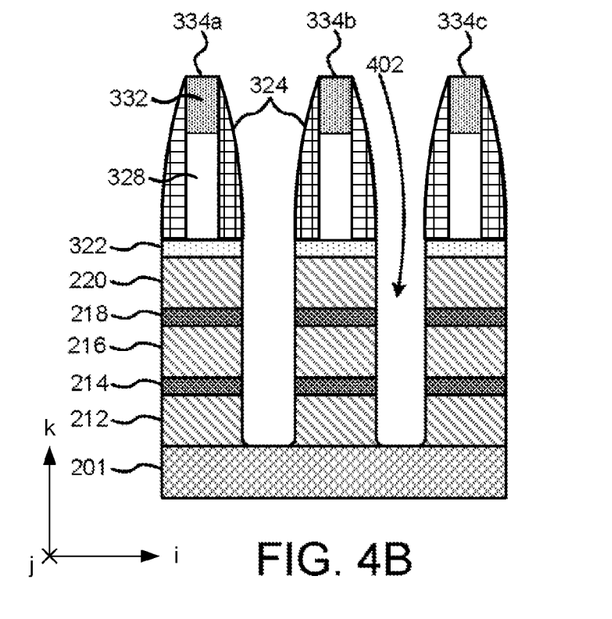

At the stages of fabrication depicted in FIGS. 4A and 4B, cavities or recesses 402 are respectively etched in regions adjacent to the gate structures 314a-c, and 334a-c. That is, the hNS stacks are respectively etched in the k-axis direction to form recesses 402. The recesses 402 may be used in later operations of fabrication to form source/drain regions. In some embodiments, the recesses 402 may reach the substrate layer 202. As can be seen in FIGS. 4A and 4B, a channel length of an hNS stack is measured in the i-axis direction.

In embodiments using hNS stacks having Si channel layers and silicon germanium sacrificial layers, tensile strain may be induced in the channel layers by the sacrificial layers during formation of the source and drain cavities or recesses 402. The formation of the source and drain recesses 402 may lead to an elastic relaxation of the stack, which results in tensile strain in the channel layers.

Figure 5A:
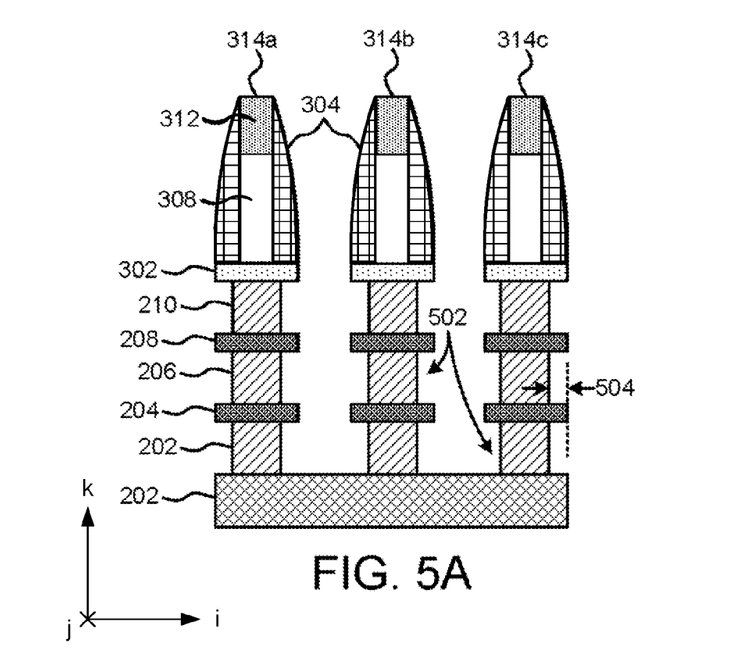
FIGS. 5A and 5B respectively depict cross-sectional view of embodiments of hNS stacks for an nMOS component and for a pMOS component at a further stage of fabrication according to the subject matter disclosed herein.
Figure 5B:
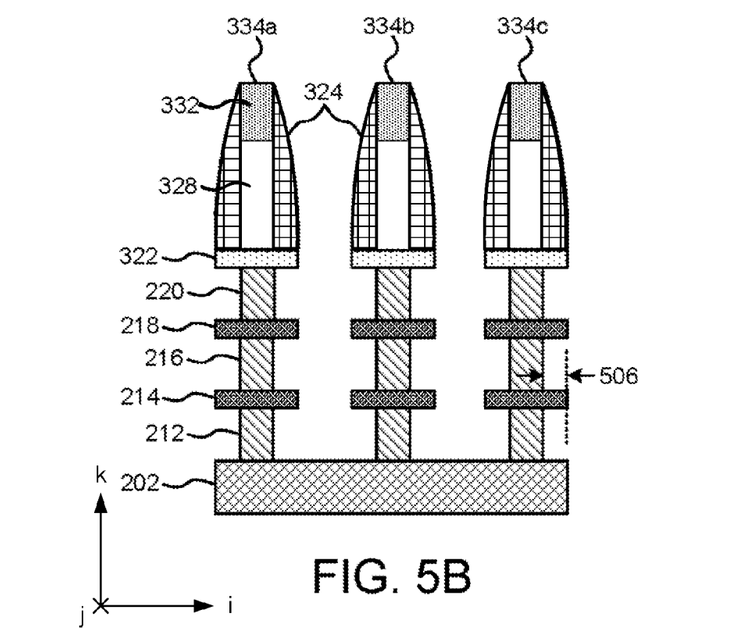

In an embodiment, as depicted in FIGS. 5A and 5B, the sacrificial layers 202, 206 and 210 of the nMOS component and the sacrificial layers 212, 216 and 220 of the pMOS component may be selectively etched back in the i-axis direction to form recesses 502 in the sacrificial layers between the channel layers. The length or depth of recesses 502 as measured in the i-axis direction may be related to a difference in the length in the i-axis direction of channel layers 204, 208, 214 and 218, and the corresponding etched sacrificial layers 202, 206, 210, 212, 216 and 220. In an embodiment, a length or depth 504 of the recess 502 in the nMOS component of FIG. 5A along the i-axis direction may be less than a length or depth 506 of the recess 502 in the pMOS component of FIG. 5B along the i-axis direction.

The sacrificial layer recess 502 for internal spacer formation may be performed at different operations of the flow for nFET and pFET devices. A longer length or depth 506 of a sacrificial layer recess 502 for a pMOS component may help to partially release undesired tensile strain in the channel of the pFET component. A reduced length or depth 504 of sacrificial layer recess 502 for a nMOS component may lead to a relatively lesser release of tensile strain in the channel of the nFET component, resulting in an nFET component having a higher tensile strain than a pFET component.

Figure 6A:
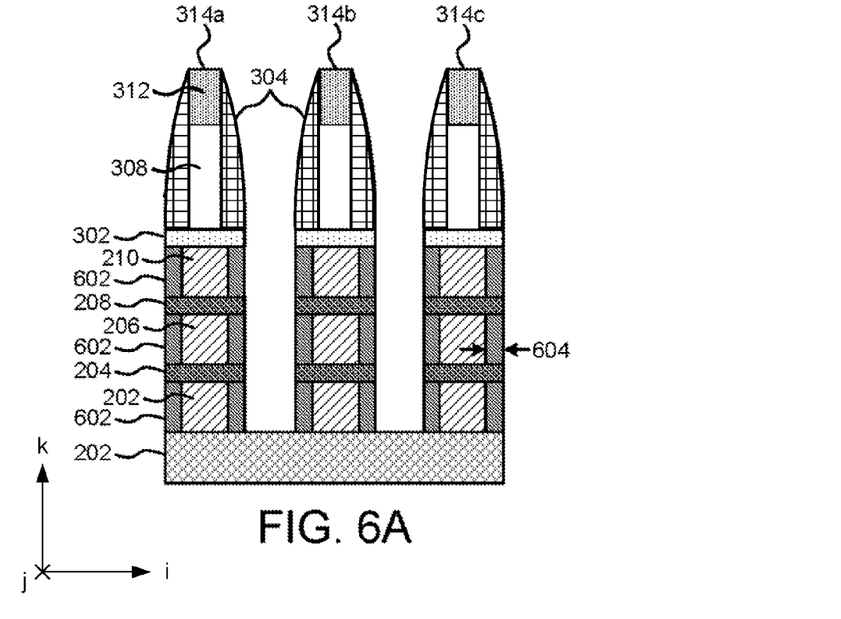
FIGS. 6A and 6B respectively depict cross-sectional view of embodiments of hNS stacks for an nMOS component and for a pMOS component at still another stage of fabrication according to the subject matter disclosed herein.
Figure 6B:
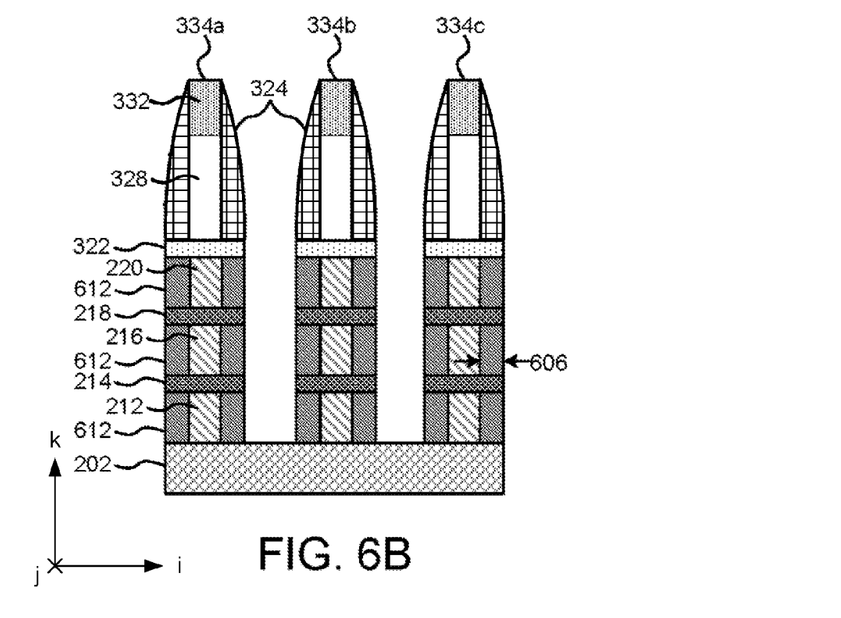

FIGS. 6A and 6B respectively depict cross-sectional view of embodiments of hNS stacks for an nMOS component and for a pMOS component after internal spacers have been formed in the recesses 502 according to the subject matter disclosed herein. In FIG. 6A, nMOS spacers 602 may be formed having a first thickness (or "length") 604 in the recesses 502 as measured in the i-axis direction. Similarly, pMOS spacers 612 are depicted in FIG. 6B, which have a second thickness (or "length") 606 that is greater than the first thickness 604 of the nMOS spacers 602 as measured in the i-axis direction. In one embodiment, the thickness 604 of the spacer may be less than the thickness 504 of the recess by etching back the nMOS spacer 602. Similarly, the pMOS spacers 612 may be thinner than the recesses 502. In embodiments in which no spacer recess is performed, the thickness 604 of nMOS spacers may be substantially equal to the thickness of nMOS sacrificial layer recesses 504, and the thicknesses 606 of pMOS spacers may be substantially equal to the thickness of pMOS sacrificial layer recesses 506.

In the described embodiments, the tensile or compressive strain of the devices may be respectively tuned or predefined by a combination of the Ge content of the sacrificial layers and the thicknesses 504, 506 of the nMOS and the pMOS recesses. In an embodiment, the Ge content in the sacrificial layer may be at least 5% higher in an nFET device than in a pFET device. In an embodiment, the difference in lengths 504 and 506 may be in a range of about 1 nm to about 5 nm.

After the operations described, the fabrication flow to fabricate hNS devices continues as is known. Subsequent operations include the formation of source and drain structures within the source and drain cavities. This may be accomplished in some embodiments by epitaxial regrowth of the source and drain within the source and drain cavities, and in some embodiments with an overgrowth of the source and drain structures beyond these cavities. In some embodiments, the source and drain structures may be grown relaxed, so that the strain in the channel may not be changed during source and drain growth. In other embodiments, source and drain regrowth may be designed to add strain in the channel when this favors a specific device.

The fabrication flow may include a replacement gate process in subsequent operations during which the sacrificial layers may be selectively removed from the channel layers (a so called "nanosheet release" process). During the nanosheet release process, a small portion of the strain in the channel may be lost by redistribution to the source and drain structures, but a large portion of the channel strain is maintained. Formation of the gate stack around the channel layers may follow nanosheet release. Additional fabrication steps may be included to complete the fabrication of the hNS devices and circuits.

Figure 7:
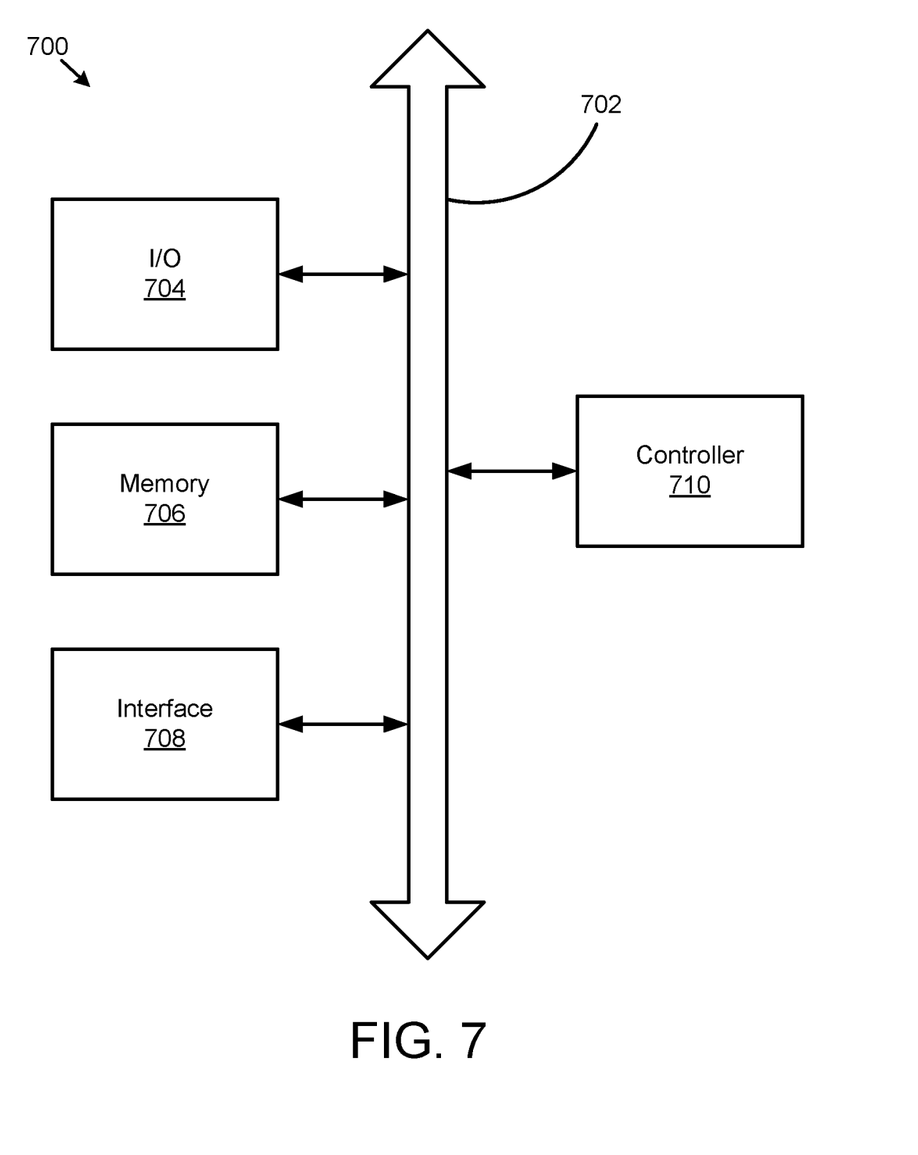
FIG. 7 depicts a block diagram of an electronic system that includes embodiments of the hNS stacks according to the subject matter disclosed herein.

FIG. 7 depicts a block diagram of an electronic system 700 that includes embodiments of the hNS stacks according to the subject matter disclosed herein. Referring to FIG. 7, the electronic system 700 may include a controller 710, an input/output (I/O) device 704, a memory device 706, an interface 708 and a bus 702. The controller 710, the I/O device 704, the memory device 706 and/or the interface 708 may be connected to one another by the bus 702. The bus 702 may serve as a path for transmitting data.

The controller 710 may include at least one of a microprocessor, a digital signal processor, a microcontroller and logic devices capable of performing similar functions to those of a microprocessor, a digital signal processor and a microcontroller. The I/O device 704 may include a keypad, a keyboard and a display device. The memory device 706 may store data and/or commands. The interface 708 may be used to transmit data to or receive data from a communication network. The interface 708 may be a wired or wireless interface. In an example, the interface 708 may include an antenna or a wired or wireless transceiver.

Although not illustrated in the drawing, the electronic system 700 may be an operating memory for improving the operation of the controller 710, and may also include a high-speed DRAM or SRAM. Here, any one of the semiconductor devices according to the above-described embodiments of the present inventive concepts may be employed as the operating memory. In addition, any one of the semiconductor devices according to the above-described embodiments may be provided in the memory device 706, in the interface 708, in the controller 710 or in the I/O device 704.

The electronic system 700 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

Although the subject matter disclosed herein is described herein with reference to specific embodiments, various modifications and changes can be made without departing from the scope of the claims, as set forth below. Accordingly, the specification and figures are to be regarded in an illustrative rather than a restrictive sense, and all such modifications are intended to be included within the scope of the claimed subject matter. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A semiconductor device, comprising:
an n channel component comprising a first horizontal nanosheet (hNS) stack and a first source/drain structure, the first hNS stack comprising a first gate structure having a plurality of first gate layers and at least one first channel layer on an underlayer, a first gate layer being in contact with the underlayer, each first channel layer being in contact with at least one first gate layer, the first source/drain structure being disposed at one end of a channel length formed by the first hNS stack, a first internal spacer being disposed between at least one first gate layer and the first source/drain structure, the first internal spacer comprising a first length; and
a p channel component comprising a second hNS stack and a second source/drain structure, the second hNS stack comprising a second gate structure having a plurality of second gate layers and at least one second channel layer on the underlayer, a second gate layer being in contact with the underlayer, each second channel layer being in contact with at least one second gate layer, the second source/drain structure being disposed at one end of a channel length formed by the second hNS stack, a second internal spacer being disposed between at least one second gate layer and the second source/drain structure, the second internal spacer comprising a second length that is greater than the first length.

2. The semiconductor device of claim 1, wherein the first length is less than the second length by about 2 nm to about 5 nm, inclusive.

3. The semiconductor device of claim 1, wherein a strain in each first channel layer comprises a tensile strain, and wherein a strain in each second channel layer comprises a neutral strain or a compressive strain.

4. The semiconductor device of claim 1, wherein a tensile strain in each second channel layer is less than a tensile strain in each first channel layer.

5. A method to form a semiconductor device, the method comprising:
forming a first horizontal nanosheet (hNS) stack for an n channel component, the first hNS stack comprising a plurality of first sacrificial layers and at least one first channel layer on an underlayer, a first sacrificial layer being in contact with the underlayer, each first channel layer being in contact with at least one first sacrificial layer, the first sacrificial layers being formed from SiGe and the at least one first channel layer being formed from Si;
forming a second hNS stack for a p channel component, the second hNS stack comprising a plurality of second sacrificial layers and at least one second channel layer on the underlayer, a second sacrificial layer being in contact with the underlayer, each second channel layer being in contact with at least one second sacrificial layer, the second sacrificial layers being formed from SiGe and the at least one second channel layer being formed from Si;
forming first source drain recesses and second source/drain recesses, the first source/drain recesses being disposed at ends of a channel formed by the first hNS stack and the second source/drain recesses being disposed at ends of a channel formed by the second hNS stack;
forming a first internal spacer recess within at least one of the first source/drain recesses between the first sacrificial layers and the first channel layers, the first internal spacer recess comprising a first length; and
forming a second internal spacer recess within at least one of the second source/drain recesses between the second sacrificial layers and the second channel layers, the second internal spacer recess comprising a second length that is greater than the first length.

6. The method of claim 5, further comprising:
forming a first internal spacer in the first internal spacer recess; and
forming a second internal spacer in the second internal spacer recess.

7. The method of claim 6, further comprising:
replacing the plurality of first sacrificial layers with a first gate structure; and
replacing the plurality of second sacrificial layers with a second gate structure.

8. The method of claim 7, wherein a strain in each first channel layer comprises a tensile strain, and wherein a strain in each second channel layer comprises a neutral strain or a compressive strain.

9. The method of claim 7, wherein a tensile strain in each second channel layer is less than a tensile strain of each first channel layer.

10. The method of claim 5, wherein the first length is less than the second length by about 2 nm to about 5 nm, inclusive.

11. The method of claim 10, wherein a percentage Ge content of the first sacrificial layers is greater than or equal to a percentage Ge content of the second sacrificial layers.

12. The method of claim 11, wherein the percentage Ge content of the first sacrificial layers is greater than the percentage Ge content of the second sacrificial layers by at least 5%.

13. A method to form a semiconductor device, the method comprising:
forming a first horizontal nanosheet (hNS) stack for an n channel component, the first hNS stack comprising a plurality of first sacrificial layers and at least one first channel layer on an underlayer, a first sacrificial layer being in contact with the underlayer, each first channel layer being in contact with at least one first sacrificial layer, the first sacrificial layers being formed from SiGe and the at least one first channel layer being formed from Si, each first sacrificial layer comprising a first percentage Ge content;
forming a second hNS stack for a p channel component, the second hNS stack comprising a plurality of second sacrificial layers and at least one second channel layer on the underlayer, a second sacrificial layer being in contact with the underlayer, each second channel layer being in contact with at least one second sacrificial layer, the second sacrificial layers being formed from SiGe and the at least one second channel layer being formed from Si, each second sacrificial layer comprising a second percentage Ge content, the second percentage Ge content being less than or equal to the first percentage Ge content;
forming first source drain recesses and second source/drain recesses, the first source/drain recesses being disposed at ends of a channel formed by the first hNS stack and the second source/drain recesses being disposed at ends of a channel formed by the second hNS stack;

forming at least one first internal spacer recess within at least one of the first source/drain recesses between the first sacrificial layers and the first channel layers; and forming at least one second internal spacer recess within at least one of the second source/drain recesses between the second sacrificial layers and the second channel layers.

14. The method of claim 13, further comprising:

forming a first internal spacer in the first internal spacer recess; and forming a second internal spacer in the second internal spacer recess.

15. The method of claim 14, further comprising:

replacing the plurality of first sacrificial layers with a first gate structure; and replacing the plurality of second sacrificial layers with a second gate structure.

16. The method of claim 13, wherein the percentage Ge content of the first sacrificial layers is greater than the percentage Ge content of the second sacrificial layers by at least about 5%.

17. The method of claim 13, wherein a strain in each first channel layer comprises a tensile strain, and wherein a strain in each second channel layer comprises a neutral strain or a compressive strain.

18. The method of claim 13, wherein a tensile strain in each second channel layer is less than a tensile strain of each first channel layer.

* * * * *